United States Patent
Kim et al.

(10) Patent No.: US 11,011,720 B2
(45) Date of Patent: May 18, 2021

(54) SEMICONDUCTOR NANOCRYSTAL PARTICLES, PRODUCTION METHODS THEREOF, AND DEVICES INCLUDING THE SAME

(71) Applicant: SAMSUNG ELECTRONICS CO., LTD., Suwon-si (KR)

(72) Inventors: Tae Hyung Kim, Seoul (KR); Sung Woo Kim, Hwaseong-si (KR); Jin A Kim, Suwon-si (KR); Yuho Won, Seoul (KR); Jeong Hee Lee, Seongnam-si (KR); Eun Joo Jang, Suwon-si (KR); Oul Cho, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 16/298,357

(22) Filed: Mar. 11, 2019

(65) Prior Publication Data
US 2019/0280233 A1    Sep. 12, 2019

(30) Foreign Application Priority Data
Mar. 9, 2018 (KR) .................. 10-2018-0028322

(51) Int. Cl.
*H01L 51/50* (2006.01)
*H01L 51/00* (2006.01)
(Continued)

(52) U.S. Cl.
CPC .......... *H01L 51/502* (2013.01); *C09K 11/883* (2013.01); *H01L 51/0037* (2013.01);
(Continued)

(58) Field of Classification Search
CPC ......... B82Y 40/00; B82Y 30/00; B82Y 20/00; C09K 11/883; C09K 11/0811; C09K 11/574
(Continued)

(56) References Cited

U.S. PATENT DOCUMENTS

| | | |
|---|---|---|
| 5,140,385 A | 8/1992 | Kukimoto et al. |
| 9,698,311 B2 | 7/2017 | Greco et al. |

(Continued)

FOREIGN PATENT DOCUMENTS

| | | |
|---|---|---|
| CN | 105399136 A | 3/2016 |
| CN | 105830236 A | 8/2016 |

(Continued)

OTHER PUBLICATIONS

Angela Fiore et al., "Raman and photoluminescence spectra of ZnTe/CdSe and ZnTe/CdTe tetrapod shaped nano-hetero structures," Superlattices and Microstructures, Oct. 27, 2017, pp. 143-146, vol. 113.
(Continued)

*Primary Examiner* — Jonathan Han
(74) *Attorney, Agent, or Firm* — Cantor Colburn LLP

(57) ABSTRACT

A quantum dot including a core including a first semiconductor nanocrystal including zinc, tellurium, and selenium and a semiconductor nanocrystal shell disposed on the core and including zinc, tellurium, selenium, and sulfur, a production method thereof, and an electronic device including the same. The quantum dot is free of cadmium, the quantum dot has a mole ratio of tellurium with respect to selenium of less than or equal to about 0.06:1, a photoluminescence peak wavelength of the quantum dot is greater than or equal to about 450 nm and less than or equal to about 470 nanometers
(Continued)

(nm), and a full width at half maximum (FWHM) of a photoluminescence peak of the quantum dot is less than or equal to about 41 nm.

23 Claims, 7 Drawing Sheets

(51) Int. Cl.

| | |
|---|---|
| *C09K 11/88* | (2006.01) |
| *B82Y 20/00* | (2011.01) |
| *B82Y 40/00* | (2011.01) |
| *H01L 51/52* | (2006.01) |
| *H01L 51/56* | (2006.01) |

(52) U.S. Cl.
CPC ...... *H01L 51/0039* (2013.01); *H01L 51/0043* (2013.01); *H01L 51/0077* (2013.01); *B82Y 20/00* (2013.01); *B82Y 40/00* (2013.01); *H01L 51/0003* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5206* (2013.01); *H01L 51/5221* (2013.01); *H01L 51/56* (2013.01); *H01L 2251/301* (2013.01); *H01L 2251/303* (2013.01); *H01L 2251/308* (2013.01); *H01L 2251/558* (2013.01)

(58) Field of Classification Search
USPC ........... 977/744; 252/519.14, 519.4, 301.6 R
See application file for complete search history.

(56) References Cited

U.S. PATENT DOCUMENTS

| | | | |
|---|---|---|---|
| 9,887,318 B2 | 2/2018 | Titov et al. | |
| 9,957,442 B2 | 5/2018 | Banin et al. | |
| 2005/0214536 A1* | 9/2005 | Schrier | ................ H01L 33/28 428/403 |
| 2009/0108235 A1 | 4/2009 | Ando et al. | |
| 2009/0230382 A1* | 9/2009 | Banin | .................... C09K 11/02 257/14 |
| 2010/0025637 A1 | 2/2010 | Asokan et al. | |
| 2010/0044635 A1* | 2/2010 | Breen | ................. C09K 11/025 252/301.6 S |
| 2013/0115455 A1 | 5/2013 | Banin et al. | |
| 2014/0117292 A1* | 5/2014 | Jun | ..................... H01L 31/0304 252/519.14 |
| 2014/0339497 A1 | 11/2014 | Qu et al. | |
| 2015/0262727 A1* | 9/2015 | Cho | .................... C09K 11/565 252/519.2 |
| 2016/0160060 A1* | 6/2016 | Kikuchi | .................. C09D 7/62 313/503 |
| 2016/0167965 A1* | 6/2016 | Jang | ...................... C09K 11/00 252/519.14 |
| 2016/0225958 A1 | 8/2016 | Kazama et al. | |
| 2016/0333267 A1 | 11/2016 | Chen et al. | |
| 2017/0352779 A1 | 12/2017 | Kuzumoto et al. | |
| 2018/0026166 A1 | 1/2018 | Kazama et al. | |
| 2018/0158985 A1 | 6/2018 | Titov et al. | |

FOREIGN PATENT DOCUMENTS

| | | |
|---|---|---|
| CN | 106381146 A | 2/2017 |
| EP | 3037195 A1 | 6/2016 |
| EP | 3401380 A1 | 11/2018 |
| JP | 2016145328 A | 8/2016 |
| KR | 20040032456 A | 4/2004 |
| KR | 20120088273 A | 8/2012 |
| KR | 20130102072 A | 9/2013 |
| KR | 20140121351 A | 10/2014 |
| KR | 20150035300 A | 4/2015 |
| KR | 20170080795 A | 7/2017 |
| WO | 2012161065 A1 | 11/2012 |

OTHER PUBLICATIONS

Extended European Search Report dated Jul. 9, 2019, of the corresponding European Patent Application No. 19161974.1.
Extended European Search Report dated Jul. 9, 2019, of the corresponding European Patent Application No. 19161979.0.
Huaibin Shen et al., "Phosphine-free synthesis of high quality ZnSe, ZnSe/ZnS, and Cu-, Mn-doped ZnSe nanocrystals," Dalton Transactions, Oct. 30, 2009, pp. 10534-10540.
Huaibin Shen et al., "Size- and shape-controlled synthesis of ZnSe nanocrystals using SeO2 as selenium precursor," Dalton Transactions, Oct. 26, 2010, pp. 11432-11438, vol. 39.
Joren Filers et al., "Unravelling the Size and Temperature Dependence of Exciton Lifetimes in Colloidal ZnSe Quantum Dots," The Journal of Physical Chemistry, Sep. 22, 2014, pp. 23313-23319, vol. 118, Issue No. 40.
Kipil Lim et al., "Synthesis of blue emitting InP/ZnS quantum dots through control of competition between etching and growth," Nanotechnology, Nov. 9, 2012, pp. 1-7, vol. 23, No. 485609.
Lanlan Chen et al., "Green chemical approaches to ZnSe quantum dots: preparation, characterisation and formation mechanism," Journal of Experimental Nanoscience, Mar. 24, 2010, pp. 106-117, vol. 5, No. 2.
Non-Final Office Action, dated Feb. 13, 2020 of U.S. Appl. No. 16/298,108.
Non-Final Office Action, dated Feb. 13, 2020 of U.S. Appl. No. 16/298,276.
Aqiang Wang et al., "Bright, efficient, and color-stable violet ZnSe-based quantum dot light-emitting diodes," Nanoscale, Jan. 5, 2015, pp. 2951-2959, vol. 7.
Christian Ippen et al., "ZnSe/ZnS quantum dots as emitting material in blue QD-LEDs with narrow emission peak and wavelength tunability," Organic Electronics, Nov. 15, 2013, pp. 126-131. vol. 15.
Wenyu Ji et al., "High color purity ZnSe/ZnS core/shell quantum dot based blue light emitting diodes with an inverted device structure," Applied Physics Letters, Jul. 30, 2013, pp. 053106-1~053106-4, vol. 103.
Final Office Action dated Jul. 27, 2020 in U.S. App. No. 16/298,108.
Chunliang Li et al., "Synthesis of Cd-free water-soluble ZnSe1-xTex nanocrystals with high luminescence in the blue region," Journal of Colloid and Interface Science, Feb. 14, 2008, pp. 468-476, vol. 321.
Kiran G Sonawane, Ch Rajesh, Mayur Temgire, Shailaja Mahamuni. A case study: Te in ZnSe and Mn-doped ZnSe quantum dots. Nanotechnology 2011, 22 (30), 305702.

\* cited by examiner

SEMICONDUCTOR NANOCRYSTAL PARTICLES, PRODUCTION METHODS THEREOF, AND DEVICES INCLUDING THE SAME

CROSS-REFERENCE TO RELATED APPLICATION

This application claims priority to and the benefit of Korean Patent Application No. 10-2018-0028322 filed in the Korean Intellectual Property Office on Mar. 9, 2018, and all the benefits accruing therefrom under 35 U.S.C. § 119, the entire content of which is incorporated herein by reference.

BACKGROUND

1. Field

A semiconductor nanocrystal particle, a production method thereof, and a device including the same are disclosed.

2. Description of the Related Art

Unlike bulk materials, in the case of the nanoparticles, some physical characteristics (e.g., energy bandgaps and melting points), which are intrinsic for the bulk materials, may be controlled by changing a particle size of the nanoparticle. For example, a semiconductor nanocrystal particle also known as a quantum dot is a nano-sized crystalline material. Such a semiconductor nanocrystal particle has a relatively small size, has a relatively large surface area per unit volume, and exhibits a quantum confinement effect, exhibiting properties different from those of a bulk material having the same composition. The quantum dot may absorb light from an excitation source to be excited and may emit energy corresponding to an energy bandgap of the quantum dot.

SUMMARY

An embodiment provides a cadmium-free semiconductor nanocrystal particle (e.g., quantum dot) capable of emitting blue light with improved efficiency.

An embodiment provides a method of producing the semiconductor nanocrystal particle.

An embodiment provides an electronic device including the semiconductor nanocrystal particle.

In an embodiment, a quantum dot includes a core including a first semiconductor nanocrystal including zinc, tellurium, and selenium and a semiconductor nanocrystal shell disposed on the core and including zinc, tellurium, selenium, and sulfur, wherein the quantum dot does not include cadmium, the quantum dot has a mole ratio of tellurium relative to selenium of less than or equal to about 0.06:1, a photoluminescence peak wavelength of the quantum dot is greater than or equal to about 450 nanometers (nm) and less than or equal to about 470 nm, and a full width at half maximum (FWHM) of a photoluminescence peak of the quantum dot is less than or equal to about 41 nm.

The quantum dot may include a mole ratio of tellurium relative to selenium of greater than about 0.005:1.

The quantum dot may include a mole ratio of tellurium with respect to zinc of greater than or equal to about 0.003:1.

The core may include $ZnTe_xSe_{1-x}$, wherein x is greater than 0 and less than or equal to about 0.05.

A size of the core may be greater than or equal to about 2 nm.

The semiconductor nanocrystal shell may include a concentration gradient wherein a concentration varies in a radial direction. In the semiconductor nanocrystal shell, an amount of tellurium may decrease in a radial direction from the core toward an outermost surface of the quantum dot. In the semiconductor nanocrystal shell, an amount of sulfur may increase in a radial direction from the core toward an outermost surface of the quantum dot.

The semiconductor nanocrystal shell may include a first layer disposed directly on the core and an outer layer disposed on the first layer, wherein the first layer includes a second semiconductor nanocrystal and the outer layer may include a semiconductor nanocrystal having a composition different from that of the second semiconductor nanocrystal.

The second semiconductor nanocrystal may include zinc, selenium, and tellurium and the outer layer may include zinc and sulfur, selenium, or a combination thereof.

The outer layer may include a first outer layer directly on the first layer, the first outer layer including a third semiconductor nanocrystal and a second outer layer disposed on the first outer layer, the second outer layer including a fourth semiconductor nanocrystal, wherein the third semiconductor nanocrystal may include zinc and selenium and the fourth semiconductor nanocrystal may include zinc and sulfur.

The quantum dot may have an external quantum efficiency (EQE), also referred to herein as quantum yield (QY), of greater than or equal to about 70%.

The full width at half maximum (FWHM) of a photoluminescence peak of the quantum dot may be less than or equal to about 35 nm.

The quantum dot may have a photoluminescence (PL) decay lifetime of greater than or equal to about 35 nanoseconds (ns).

In an embodiment, a method of producing the quantum dot may include obtaining a core including a first semiconductor nanocrystal including zinc, selenium, and tellurium; and forming a semiconductor nanocrystal shell including zinc, selenium, tellurium, and sulfur on a surface of the core by reacting a zinc precursor with a selenium precursor, a tellurium precursor, a sulfur precursor, or a combination thereof in a plurality of times in an organic solvent and in the presence of the core and an organic ligand to produce the quantum dot.

The forming of the semiconductor nanocrystal shell may include reacting the zinc precursor with the selenium precursor and the tellurium precursor and reacting the zinc precursor with the selenium precursor, the sulfur precursor, or a combination thereof.

The core including the first semiconductor nanocrystal may include a mole ratio of the tellurium with respect to the selenium of less than or equal to about 0.05:1.

In an embodiment, an electroluminescent device includes a first electrode and a second electrode facing each other; and a quantum dot emission layer disposed between the first electrode and the second electrode and including a plurality of quantum dots, wherein the plurality of quantum dots include the quantum dot.

The electroluminescent device may include a charge auxiliary layer between the first electrode and the quantum dot emission layer, between the second electrode and the quantum dot emission layer, or between the first electrode and the quantum dot emission layer and between the second electrode and the quantum dot emission layer.

The charge auxiliary layer may include a charge transport layer, a charge injection layer, or a combination thereof.

The electroluminescent device may have a maximum external quantum efficiency of greater than or equal to about 4%.

The electroluminescent device may be configured to emit light having an x value of a CIE color space chromaticity diagram of less than or equal to about 0.2.

A cadmium-free semiconductor nanocrystal particle capable of emitting blue light may be provided. The produced semiconductor nanocrystal particle may be applied to, e.g., used in, various display devices and biolabeling (e.g., a biosensor or bioimaging), a photodetector, a solar cell, a hybrid composite, and the like.

BRIEF DESCRIPTION OF THE DRAWINGS

The above and other advantages and features of this disclosure will become more apparent by describing in further detail exemplary embodiments thereof with reference to the accompanying drawings.

DETAILED DESCRIPTION

Figure 1:
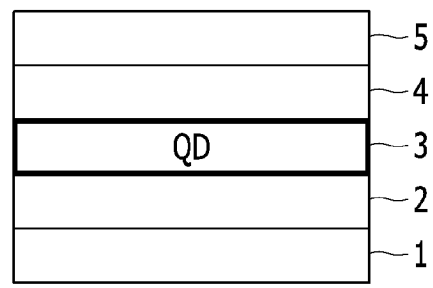
FIG. 1 is a schematic cross-sectional view of a quantum dot light emitting diode (QD LED) device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a moiety wherein at least one of the hydrogen atoms thereof is replaced by a substituent provided that the substituted atom's normal valence is not exceeded, selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—$NO_2$), a cyano group (—CN), an amino group (—NRR' wherein R and R' are independently hydrogen or a C1 to C6 alkyl group), an azido group (—$N_3$), an amidino group (—O(═NH)$NH_2$)), a hydrazino group (—$NHNH_2$), a hydrazono group (═N($NH_2$)), an aldehyde group (—O(═O)H), a carbamoyl group (—C(O)$NH_2$), a thiol group (—SH), an ester group (—O(═O)OR, wherein R is a C1 to C6 alkyl group or a C6 to C12 aryl group), a carboxyl group (—COOH) or a salt thereof (—O(═O)OM, wherein M is an organic or inorganic cation), sulfonic acid group (—$SO_3H$) or a salt thereof (—$SO_3M$, wherein M is an organic or inorganic cation), phosphoric acid group (—$PO_3H_2$) or a salt thereof (—$PO_3MH$ or —$PO_3M_2$, wherein M is an organic or inorganic cation), or a combination thereof.

Herein, a "hydrocarbon group" refers to a group including carbon and hydrogen (e.g., an alkyl, alkenyl, alkynyl, or aryl group). The hydrocarbon group may be a group having a monovalency or greater, for example, a monovalent, divalent, or tetravalent group, formed by removal of one or more hydrogen atoms from, for example, an aliphatic or aromatic hydrocarbon group such as alkane, alkene, alkyne, or arene. In the hydrocarbon group, at least one methylene moiety ($-CH_2-$) may be replaced by an oxide moiety ($-O-$), a carbonyl moiety ($-C=O-$), an ester moiety, $-NH-$, or a combination thereof. Alternatively, the hydrocarbon group may consist of carbon and hydrogen.

Herein, "aliphatic" refers to a saturated or unsaturated linear or branched hydrocarbon group. An aliphatic group may be an alkyl, alkenyl, or alkynyl group, for example.

Herein, "alkyl" refers to a linear or branched saturated monovalent hydrocarbon group (methyl, ethyl hexyl, or the like).

Herein, "alkenyl" refers to a linear or branched monovalent hydrocarbon group having one or more carbon-carbon double bond.

Herein, "alkynyl" refers to a linear or branched monovalent hydrocarbon group having one or more carbon-carbon triple bond.

The "aryl" may refer to a group formed by removal of at least one hydrogen from an aromatic group (e.g., phenyl or naphthyl group).

Herein, "aromatic" refers to an organic compound or group comprising at least one unsaturated cyclic group having delocalized pi electrons. The term encompasses both hydrocarbon aromatic compounds and heteroaromatic compounds.

Herein, "hetero" refers to one including 1 to 3 heteroatoms that may be N, O, S, Si, P, or a combination thereof.

Herein, "Group" refers to a group of Periodic Table.

A semiconductor nanocrystal particle (hereinafter, also referred to as a quantum dot) may absorb light from an excitation source and may emit energy corresponding to the energy bandgap of the semiconductor nanocrystal particle. Energy bandgaps of quantum dots may be varied with particle size and composition of the nanocrystal. For example, as the particle size of the semiconductor nanocrystal particle increases, the energy bandgap of the semiconductor nanocrystal particle may become narrower and the light emitting wavelength of the semiconductor nanocrystal particle may increase. Semiconductor nanocrystals may be used as a light emitting material in various fields of a display device, an energy device, or a bio light emitting device.

Quantum dots having a photoluminescence (PL) property at an applicable level may include cadmium (Cd). Cadmium causes environment/health problems and is one of the restricted elements via Restriction of Hazardous Substances Directive (RoHS) in many countries. Accordingly, development of a cadmium-free semiconductor nanocrystal particle having improved photoluminescence characteristics is desired. In order to be applied to, e.g., used in, a quantum dot light emitting diode (QLED) display device, a semiconductor nanocrystal particle having a relatively narrow full width at half maximum (FWHM) and capable of emitting pure blue light (e.g., having a PL peak of about 455 nm) may be desired. For example, a blue light emitting material having a narrow full width at half maximum (FWHM) may be desired in order to be applied to, e.g., used in, a display device having a relatively high (e.g., about 90% or greater) color reproducibility based on the next generation color standard BT2020. However, a cadmium-free semiconductor nanocrystal particle having photoluminescence properties at an applicable level and the aforementioned PL peak wavelength may not be easy to prepare and is desired.

A semiconductor nanocrystal particle according to an embodiment has a structure and a composition which will be described later and may be free of cadmium while emitting blue light. The quantum dot or the core of an embodiment may not include manganese, copper, or a combination thereof.

The quantum dot of an embodiment does not include cadmium and includes a core including a first semiconductor nanocrystal including zinc, tellurium, and selenium and a semiconductor nanocrystal shell disposed on the core and including zinc, tellurium, selenium, and sulfur. In the quantum dot, a mole ratio of tellurium with respect to selenium may be less than or equal to about 0.06:1. The quantum dot may emit blue light having maximum photoluminescence peak in a wavelength of greater than or equal to about 450 nm and less than or equal to about 470 nm. The full width at half maximum (FWHM) of a photoluminescence peak of the quantum dot is less than or equal to about 41 nm.

The first semiconductor nanocrystal may include a limited amount of tellurium (Te). The core may include $ZnTe_xSe_{1-x}$, wherein x is greater than 0 and less than or equal to about 0.05. In the core, an amount of the tellurium may be greater than or equal to about 0.001 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, greater than or equal to about 0.02 moles, or greater than or equal to about 0.025 mol, with respect to 1 mole of selenium. In the core, an amount of the tellurium may be less than or equal to about 0.053 moles, for example, less than or equal to about 0.05 moles, less than or equal to about 0.049 moles, less than or equal to about 0.048 moles, less than or equal to about 0.047 moles, less than or equal to about 0.046 moles, less than or equal to about 0.045 moles, less than or equal to about 0.044 moles, less than or equal to about 0.043 moles, less than or equal to about 0.042 moles, less than or equal to about 0.041 moles, less than or equal to about 0.04 moles, less than or equal to about 0.035 moles, less than or equal to about 0.03 mol, or less than or equal to about 0.025, with respect to 1 mole of selenium.

A size (e.g., a diameter) of the core may be greater than or equal to about 2 nm, greater than or equal to about 3 nm, or greater than or equal to about 3.5 nm. The size of the core may be less than or equal to about 5 nm, or less than or equal to about 4 nm.

In the core, a ratio of the tellurium amount with respect to the selenium amount may be increased to increase a wavelength of the maximum photoluminescence peak of the quantum dot. However, an increase of the tellurium amount may cause a decrease in efficiency of the produced quantum dot and an increase of a full width at half maximum (FWHM). The quantum dot according to an embodiment may have a semiconductor nanocrystal shell disposed on the core, wherein the semiconductor nanocrystal shell includes zinc, tellurium, selenium, and sulfur and may exhibit a maximum photoluminescence peak in a blue wavelength range of greater than or equal to about 450 nm while exhibiting improved luminous efficiency, e.g., QY or EQE, and a narrower full width at half maximum (FWHM). The quantum dot of an embodiment, when applied to, e.g., used in, an electroluminescent device, may achieve improved electroluminescent properties (e.g., increased external quantum efficiency and increased luminance) and improved lifetime.

In an embodiment, the quantum dot has a semiconductor nanocrystal shell including zinc, tellurium, selenium, and sulfur which is disposed on the core. The semiconductor nanocrystal shell may have a gradient composition having a concentration varying in a radial direction. In the semiconductor nanocrystal shell, an amount of the tellurium may decrease is a direction from the core toward an outermost surface of the quantum dot. In the semiconductor nanocrystal shell, an amount of sulfur may increase is a direction from the core toward an outermost surface of the quantum dot.

The semiconductor nanocrystal shell may include at least two layers and adjacent layers may have a different composition. In an embodiment, the semiconductor nanocrystal shell may include a first layer disposed directly on the core and at least one outer layer (e.g., a second layer, a third layer, etc.) disposed on the first layer. The first layer may include a second semiconductor nanocrystal and the outer layer (e.g., the second layer or the third layer) may include a third semiconductor nanocrystal having a different composition from the second semiconductor nanocrystal.

The second semiconductor nanocrystal may include zinc and selenium. The outer layer may include a semiconductor nanocrystal including zinc, and selenium, sulfur, or a combination thereof. The first layer and optionally at least one of the outer layer(s) may further include tellurium (e.g., doped with tellurium). The first layer may include tellurium. In an embodiment, the second semiconductor nanocrystal may include zinc, selenium, and tellurium. The outer layer of the semiconductor nanocrystal shell may include a second layer including a third semiconductor nanocrystal including zinc and selenium and a third layer including a fourth semiconductor nanocrystal including zinc and sulfur. The third layer may be an outermost layer of the semiconductor nanocrystal. The fourth semiconductor nanocrystal may have a larger energy bandgap than the second semiconductor nanocrystal and the third semiconductor nanocrystal.

In the semiconductor nanocrystal shell, a mole ratio of tellurium with respect to selenium may be greater than or equal to about 0.0005:1, for example, greater than or equal to about 0.001:1, greater than or equal to about 0.002:1, greater than or equal to about 0.003:1, greater than or equal to about 0.004:1, greater than or equal to about 0.005:1, or greater than or equal to about 0.006:1. In the semiconductor nanocrystal shell, a mole ratio of tellurium with respect to selenium may be less than or equal to about 0.1:1, less than or equal to about 0.05:1, less than or equal to about 0.02:1, less than or equal to about 0.015:1, less than or equal to about 0.01:1, or less than or equal to about 0.009:1. Measurement of the amount of each component in the quantum dot may be confirmed by appropriate means such as, for example, inductively coupled plasma atom emission spectrometry (ICP-AES).

Accordingly, in the quantum dot according to an embodiment, a mole ratio of tellurium with respect to selenium may be less than or equal to about 0.06:1, for example, 0.055:1, less than or equal to about 0.050:1, less than or equal to about 0.045:1, or less than or equal to about 0.04:1. In the quantum dot according to an embodiment, a mole ratio of tellurium with respect to selenium may be greater than or equal to about 0.005:1, greater than or equal to about 0.006:1, greater than or equal to about 0.007:1, greater than or equal to about 0.008:1, greater than or equal to about 0.009:1, greater than or equal to about 0.01:1, greater than or equal to about 0.011:1, greater than or equal to about 0.012:1, greater than or equal to about 0.013:1, greater than or equal to about 0.014:1, or greater than or equal to about 0.015:1.

In the quantum dot according to an embodiment, a mole ratio of tellurium with respect to zinc may be less than or equal to about 0.1:1, for example, less than or equal to about 0.05:1, less than or equal to about 0.04:1, less than or equal to about 0.03:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, less than or equal to about 0.01:1, less than or equal to about 0.009:1, or less than or equal to about 0.008:1. In the quantum dot according to an embodiment, a mole ratio of tellurium with respect to zinc may be greater than or equal to about 0.0005:1, for example, greater than or equal to about 0.001:1, greater than or equal to about 0.002:1, greater than or equal to about 0.003:1, greater than or equal to about 0.004:1, or greater than or equal to about 0.005:1.

In the quantum dot according to an embodiment, a mole ratio of selenium with respect to sulfur may be greater than or equal to about 0.09:1, for example, greater than or equal to about 0.1:1, greater than or equal to about 0.2:1, greater than or equal to about 0.3:1, greater than or equal to about 0.4:1, greater than or equal to about 0.5:1, greater than or equal to about 0.6:1, or greater than or equal to about 0.7:1. In the quantum dot according to an embodiment, a mole ratio of selenium with respect to sulfur may be less than or equal to about 2:1, for example, less than or equal to about 1.8:1, less than or equal to about 1.5:1, less than or equal to about 1.4:1, less than or equal to about 1.3:1, less than or equal to about 1.2:1, less than or equal to about 1.1:1, less than or equal to about 1.0:1, less than or equal to about 0.9:1, or less than or equal to about 0.8:1.

In the quantum dot according to an embodiment, a ratio of the sum of sulfur and selenium with respect to zinc may be greater than or equal to about 0.7:1, for example, greater than or equal to about 0.8:1 and less than about 1:1, for example, less than or equal to about 0.9:1. In the quantum dot, a mole ratio of sulfur with respect to Zn may be greater than or equal to about 0.4:1, or greater than or equal to about 0.5:1. In the quantum dot, a mole ratio of sulfur with respect to Zn may be less than or equal to about 0.9:1, less than or equal to about 0.8:1, less than or equal to about 0.7:1, or less than or equal to about 0.6:1. In the quantum dot, a mole ratio of Se with respect to Zn may be greater than or equal to about 0.1:1, greater than or equal to about 0.2:1, or greater than or equal to about 0.3:1. In the quantum dot, a mole ratio of Se with respect to Zn may be less than or equal to about 0.9:1, less than or equal to about 0.8:1, less than or equal to about 0.7:1, less than or equal to about 0.6:1, less than or equal to about 0.5:1, or less than or equal to about 0.4:1.

The quantum dot may have any suitable shape. The quantum dot may have a spherical shape, a polygonal shape, a multipod shape, or a combination thereof. In an embodiment, the quantum dot may have a multipod shape. The multipod may have more than one branch (e.g., three or more or four or more) branches and a valley between them.

A size (e.g., an average size) of the quantum dot(s) may be greater than or equal to about 3 nm, for example, greater than or equal to about 4 nm, greater than or equal to about 5 nm, greater than or equal to about 6 nm, greater than or equal to about 7 nm, greater than or equal to about 8 nm, or greater than or equal to about 9 nm. The size (or the average size) of the quantum dot(s) may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, or less than or equal to about 16 nm. Herein, the (average) size of the quantum dot(s) may be a diameter. In an embodiment, the quantum dot has a polygonal shape or a multipod shape, and a size of the quantum dot may be a diameter calculated from an electron microscope image of the quantum dot under an assumption that the particle has a spherical shape.

The quantum dot according to an embodiment may emit blue light having a maximum luminescence peak in a wavelength of greater than or equal to about 450 nm, for example, greater than or equal to about 451 nm and less than or equal to about 470 nm, e.g., less than about 470 nm, or less than or equal to about 460 nm. The blue light may have a maximum photoluminescence peak wavelength of about 450 nm to about 460 nm. The maximum peak photoluminescence may have a full width at half maximum (FWHM) of less than or equal to about 40 nm, for example, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, or less than or equal to about 27 nm.

The semiconductor nanocrystal particle may have an external quantum efficiency of greater than or equal to about 70%, for example, greater than or equal to about 71%, greater than or equal to about 72%, greater than or equal to about 73%, greater than or equal to about 74%, greater than or equal to about 75%, greater than or equal to about 76%, greater than or equal to about 77%, greater than or equal to about 78%, or greater than or equal to about 79%. The semiconductor nanocrystal particle may have an external quantum efficiency of greater than or equal to about 80%, greater than or equal to about 90%, greater than or equal to about 95%, greater than or equal to about 99%, or about 100%.

In an embodiment, a method of producing the quantum dot according to an embodiment includes obtaining a core including a first semiconductor nanocrystal including zinc, selenium, and tellurium (hereinafter referred to as a "core");

reacting a zinc precursor with a non-metal precursor of a selenium precursor, a tellurium precursor, a sulfur precursor, or a combination thereof, e.g., a plurality of times, in an organic solvent in the presence of the core and the organic ligand to form a semiconductor nanocrystal shell including zinc, selenium, tellurium, and sulfur on a surface of the core.

The formation of the semiconductor nanocrystal shell may include reacting the zinc precursor with the selenium precursor and the tellurium precursor and then reacting the zinc precursor with the selenium precursor, the sulfur precursor, or a combination thereof.

In an embodiment, the core may be obtained by preparing a zinc precursor solution including a zinc precursor and an organic ligand; preparing a selenium precursor and a tellurium precursor; and heating the zinc precursor solution up to a first reaction temperature and adding the selenium precursor and the tellurium precursor and an organic ligand and performing a reaction.

The zinc precursor may be a Zn metal powder, ZnO, an alkylated Zn compound (e.g., C2 to C30 dialkyl zinc such as diethyl zinc), a Zn alkoxide (e.g., zinc ethoxide), a Zn carboxylate (e.g., zinc acetate), Zn nitrate, Zn perchlorate, Zn sulfate, Zn acetylacetonate, a Zn halide (e.g., zinc chloride), Zn cyanide, Zn hydroxide, or a combination thereof. Examples of the zinc precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-tributylphosphine (Te-TBP), tellurium-triphenylphosphine (Te-TPP), tellurium-diphenylphosphine (Te-m DPP), or a combination thereof, but is not limited thereto.

The sulfur precursor may be hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The organic solvent may include a C6 to C22 primary amine such as hexadecylamine, a C6 to C22 secondary amine such as dioctylamine, a C6 to C40 tertiary amine such as trioctylamine, a nitrogen-containing heterocyclic compound such as pyridine, C6 to C40 olefin such as octadecene, C6 to C40 aliphatic hydrocarbon group such as hexadecane, octadecane, or squalane, aromatic hydrocarbon group substituted with a C6 to C30 alkyl group such as phenyldodecane, phenyltetradecane, or phenyl hexadecane, a primary, secondary, or tertiary phosphine substituted with at least one (e.g., 1, 2, or 3) C6 to C22 alkyl group (e.g., trioctylamine), phosphine oxide substituted with (e.g., 1, 2, or 3) C6 to C22 alkyl group (e.g., trioctyl phosphine oxide), C12 to C22 aromatic ether such as phenyl ether or benzyl ether, or a combination thereof.

The organic ligand may coordinate, e.g., bind to, the surface of the produced nanocrystal and may have an effect on light emitting and electric characteristics and may effectively disperse the nanocrystal in the solution phase. The organic ligand may include, RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$, wherein, R and R' independently include C1 to C24 substituted or unsubstituted aliphatic hydrocarbon group, C6 to C20 substituted or unsubstituted aromatic hydrocarbon group, or a combination thereof, or a combination thereof. One or more ligands may be used.

Specific examples of the organic ligand compound may be methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; phosphine such as methyl phosphine, ethyl phosphine, propyl phosphine, butyl phosphine, pentyl phosphine, tributylphosphine, or trioctylphosphine; a phosphine oxide compound such as methyl phosphine oxide, ethyl phosphine oxide, propyl phosphine oxide, butyl phosphine oxide, or trioctylphosphine oxide; a diphenyl phosphine or triphenyl phosphine compound, or an oxide compound thereof; phosphonic acid, and the like, but are not limited thereto. One or more organic ligand compounds may be used. In an embodiment, the organic ligand compound may be a combination of RCOOH and amine (e.g., $RNH_2$, $R_2NH$, and/or $R_3N$).

In the core including the first semiconductor nanocrystal, a mole ratio of tellurium with respect to selenium may be less than or equal to about 0.05:1. In order to form the core, an amount of the selenium precursor during formation of the core may be greater than or equal to about 20 moles, for example, greater than or equal to about 25 moles, greater than or equal to about 26 moles, greater than or equal to about 27 moles, greater than or equal to about 28 moles, greater than or equal to about 29 moles, greater than or equal to about 30 moles, greater than or equal to about 31 moles, greater than or equal to about 32 moles, greater than or equal to about 33 moles, greater than or equal to about 34 moles, greater than or equal to about 35 moles, greater than or equal to about 36 moles, greater than or equal to about 37 moles, greater than or equal to about 38 moles, greater than or equal to about 39 moles, or greater than or equal to about 40 moles, with respect to 1 mole of the tellurium precursor during formation of the core. The amount of the selenium precursor may be less than or equal to about 60 moles, less than or equal to about 59 moles, less than or equal to about 58 moles, less than or equal to about 57 moles, less than or equal to about 56 moles, or less than or equal to about 55 moles, with respect to 1 mole of the tellurium precursor. Within the amount ranges, the core having the composition described above may be formed.

The first reaction temperature may be greater than or equal to about 280° C., for example, greater than or equal to about 290° C. A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours but is not limited thereto. By controlling the reaction time, the size of the core may be adjusted.

Reaction conditions such as a reaction temperature or time for shell formation may be appropriately selected considering a desired shell composition. For example, the amount of the selenium in the solution for shell formation may be greater than or equal to about 120 moles with respect to one mole of tellurium, but is not limited thereto. In an embodiment, under vacuum, a solvent and optionally the organic ligand are heated (or treated under vacuum) at a predetermined temperature (e.g., greater than or equal to about 100° C.), an atmosphere of the solvent and optionally the organic ligand is converted into an inert gas atmosphere, and the solvent and optionally the organic ligand are heated again at a predetermined temperature (e.g., greater than or equal to about 100° C.). Subsequently, the core is added, shell precursors are sequentially or simultaneously added, and then heated at a predetermined reaction temperature to perform a reaction. A mixture having a different ratio of the shell precursors may be sequentially added during a reaction to form a shell (e.g., having a gradient or a multi-layer) having a desired composition. In an embodiment, the zinc precursor, the selenium precursor and the tellurium precursor are first reacted to form a first layer, subsequently, the zinc precursor and the selenium precursor are reacted to form a second layer, and then, the zinc precursor and the sulfur precursor are reacted to form a third layer. A reaction temperature for forming the sell may be greater than or equal to about 280° C., for example, greater than or equal to about 290° C., greater than or equal to about 300° C., or greater than or equal to about 310° C. and less than or equal to about 330° C., for example, less than or equal to about 325° C.

In the reaction system, an amount and a concentration of each precursor may be selected considering compositions of the core and shell and reactivity between precursors.

After completing the reaction, a nonsolvent is added to reaction products and nanocrystal particles coordinated with, e.g., bound to, the ligand compound may be separated. The nonsolvent may be a polar solvent that is miscible with the solvent used in the core formation and/or shell formation reactions and is not capable of dispersing the produced nanocrystals therein. The nonsolvent may be selected depending the solvent used in the reaction and may be, for example, acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The nanocrystal particles may be separated through centrifugation, sedimentation, chromatography, or distillation. The separated nanocrystals may be added to a washing solvent and washed, if desired. The washing solvent has no particular limit and may have a similar solubility parameter to that of the ligand and may include, for example, hexane, heptane, octane, chloroform, toluene, benzene, and the like.

The quantum dots of the embodiment may not be dispersible to, e.g., in, water, any of the foregoing listed non-solvent, or a mixture thereof. The quantum dots of the embodiment may be water-insoluble.

The quantum dots of the embodiments may be dispersed the aforementioned organic solvent. In some embodiments, the quantum dots may be dispersed in a C6 to C40 aliphatic hydrocarbon, a C6 to C40 aromatic hydrocarbon, or a mixture thereof.

In an embodiment, an electronic device includes the semiconductor nanocrystal particle. The device may include a display device, a light emitting diode (LED), an organic light emitting diode (OLED), a quantum dot LED, a sensor, a solar cell, an image sensor, or a liquid crystal display (LCD), but is not limited thereto.

In an embodiment, an electronic device includes the semiconductor nanocrystal particle. The device may include a display device, a light emitting diode (LED), an organic light emitting diode (OLED), a quantum dot LED, a sensor, a solar cell, an image sensor, or a liquid crystal display (LCD), but is not limited thereto. In an embodiment, the electronic device may be a photoluminescent device (e.g., a lighting such as a quantum dot sheet or a quantum dot rail or a liquid crystal display (LCD)) or an electroluminescent device (e.g., QD LED). In an embodiment, the electronic device may include a quantum dot sheet and the semiconductor nanocrystal particle may be included in the quantum dot sheet (e.g., in a form of a semiconductor nanocrystal-polymer composite).

Figure 2:
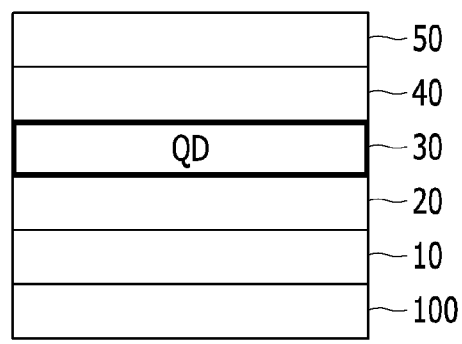
FIG. 2 is a schematic cross-sectional view of a QD LED device according to an embodiment.

In an embodiment, the electronic device may be an electroluminescent device. The electronic device may include an anode 1 and a cathode 5 facing each other and a quantum dot emission layer 3 disposed between the anode and the cathode and including a plurality of quantum dots, and the plurality of quantum dots may include the semiconductor nanocrystal particle (see FIG. 2).

The cathode may include an electron injection conductor having a low work function. The anode may include a hole injection conductor having a relatively high work function. The electron/hole injection conductor may include a metal-based material (aluminum, magnesium, tungsten, nickel, cobalt, platinum, palladium, calcium, LiF, and the like) (e.g., a metal, a metal compound, an alloy, a combination thereof), a metal oxide such as gallium indium oxide or indium tin oxide, or a conductive polymer (e.g., having a relatively high work function) such as polyethylene dioxythiophene, but is not limited thereto.

At least one of the cathode and the anode may be a light transmitting electrode or a transparent electrode. In an embodiment, both the anode and the cathode may be light transmitting electrodes. The electrode may be patterned.

The light transmitting electrode may be made of, for example, a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multi-layer but is not limited thereto. When one of the cathode and the anode is a non-light transmitting electrode, the non-light transmitting cathode or anode may be made of, for example, an opaque conductor such as aluminum (Al), a lithium aluminum (Li:Al) alloy, a magnesium-silver alloy (Mg:Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

Thicknesses of the anode and the cathode are not particularly limited and may be selected considering device efficiency. For example, the thickness of the anode (or the cathode) may be greater than or equal to about 5 nm, for example, greater than or equal to about 50 nm, but is not limited thereto. For example, the thickness of the anode (or the cathode) may be less than or equal to about 100 micrometers (μm), for example, less than or equal to about 10 um, less than or equal to about 1 μm, less than or equal to about 900 nm, less than or equal to about 500 nm, or less than or equal to about 100 nm, but is not limited thereto.

The quantum dot emission layer includes a plurality of quantum dots. The plurality of quantum dots includes the quantum dot according to the embodiments. The quantum dot emission layer may include a monolayer of the quantum dots.

The electronic device may include charge (hole or electron) auxiliary layers between the anode and the cathode. For example, the electronic device may include a hole auxiliary layer 2 or an electron auxiliary layer 4 between the anode and the quantum dot emission layer and/or between the cathode and the quantum dot emission layer. (see FIG. 1)

The hole auxiliary layer may include, for example, a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer but is not limited thereto. A thickness of each layer may be selected appropriately. For example, each thickness of the layer may be greater than or equal to about 1 nm and less than or equal to about 500 nm but is not limited thereto. The hole injection layer may be an organic layer that is formed by a solution process (e.g., spin coating etc.) such as poly(3,4-ethylenedioxythiophene):poly(styrene sulfonate) (PEDOT:PSS). The hole transport layer may be an organic layer that is formed by a solution process (e.g., spin coating etc.).

The electron auxiliary layer may include, for example, an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer but is not limited thereto. A thickness of each layer may be desirably selected. For example, each thickness of the layer may be greater than or equal to about 1 nm and less than or equal to about 500 nm but is not limited thereto. The electron injection layer may be an organic layer formed by deposition. The electron transport layer may include an inorganic oxide nanoparticle or may be an organic layer formed by deposition.

The quantum dot emission layer may be disposed in the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include, for example, an organic material, an inorganic material, or an organic/inorganic material. The organic material may be a compound having hole or electron-related properties. The inorganic material may be, for example, a metal oxide such as molybdenum oxide, tungsten oxide, zinc oxide, or nickel oxide, but is not limited thereto.

The hole transport layer (HTL) and/or the hole injection layer may include, for example, poly(3,4-ethylenedioxythiophene):poly(styrene sulfonate) (PEDOT:PSS), poly(9,9-dioctyl-fluorene-co-N-(4-butylphenyl)-diphenylamine) (TFB), polyarylamine, poly(N-vinylcarbazole), polyaniline, polypyrrole, NN,N,N',N'-tetrakis (4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

The electron blocking layer (EBL) may include, for example, poly(3,4-ethylenedioxythiophene):poly(styrene sulfonate) (PEDOT:PSS), poly(9,9-dioctyl-fluorene-co-N-(4-butylphenyl)-diphenylamine) (TFB) polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

The electron transport layer (ETL) and/or the electron injection layer may include, for example, 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, 8-(4-(4,6-di(naphthalen-2-yl)-1,3,5-triazin-2-yl)phenyl)quinolone (ET204), 8-hydroxyquinolinato lithium (Liq), an n-type metal oxide (e.g., a zinc oxide, HfO$_2$, etc.), or a combination thereof, but is not limited thereto.

The hole blocking layer (HBL) may include, for example, 1,4,5,8-naphthalene-tetracarboxylic dianhydride (NTCDA), bathocuproine (BCP), tris[3-(3-pyridyl)-mesityl] borane (3TPYMB), LiF, Alq$_3$, Gaq3, Inq3, Znq2, Zn(BTZ)$_2$, BeBq$_2$, or a combination thereof, but is not limited thereto.

In a device according to an embodiment, an anode disposed on a transparent substrate 100 may include a metal oxide-based transparent electrode (e.g., ITO electrode) and a cathode 50 facing the anode may include a metal (Mg, Al, etc.) of a relatively low work function. For example, a hole auxiliary layer 20, for example, a hole transport layer including TFB and/or poly(9-vinylcarbazole) (PVK) and/or a hole injection layer including PEDOT:PSS and/or a p-type metal oxide may be disposed between the transparent electrode 10 and the emission layer 30. An electron auxiliary layer 40 such as an electron injection layer/transport layer may be disposed between the quantum dot emission layer 30 and the cathode 50. (see FIG. 2)

Figure 3:
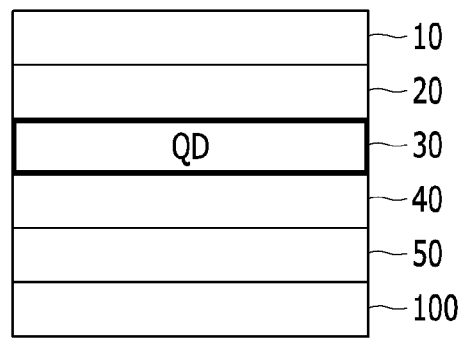
FIG. 3 is a schematic cross-sectional view of a QD LED device according to an embodiment.

A device according to an embodiment has an inverted structure. Herein, the cathode 50 disposed on a transparent substrate 100 may include a metal oxide-based transparent electrode (e.g., ITO) and the anode 10 facing the cathode may include a metal (e.g., Au, Ag, etc.) of a relatively high work function. For example, an n-type metal oxide (ZnO) may be disposed between the transparent electrode 50 and the emission layer 30 as an electron auxiliary layer 40 (e.g., an electron transport layer (ETL)). MoO$_3$ or another p-type metal oxide as a hole auxiliary layer 20 (e.g., a hole transport layer (HTL) including TFB and/or PVK and/or a hole injection layer (HIL) including MoO$_3$ or another p-type metal oxide) may be disposed between the metal anode 10 and the quantum dot emission layer 30 as a hole auxiliary layer (e.g., hole transport layer (HTL)). (see FIG. 3)

Hereinafter, specific examples are illustrated. However, these examples are exemplary, and the present disclosure is not limited thereto.

EXAMPLES

Analysis Method
1. Photoluminescence Analysis

Photoluminescence (PL) spectra of the produced nanocrystals are obtained using a Hitachi F-7000 spectrometer at an irradiation wavelength of 372 nanometers (nm).
2. Ultraviolet (UV) Spectroscopic Analysis UV spectroscopic analyses are performed by using a Hitachi U-3310 spectrometer to obtain UV-Visible absorption spectra.
3. Inductively Coupled Plasma (ICP) Analysis Inductively coupled plasma-atomic emission spectroscopic (ICP-AES) analyses are performed using Shimadzu ICPS-8100.
4. Electroluminescence Spectroscopic Analysis A current depending on a voltage is measured using a Keithley 2635B source meter while applying a voltage and EL luminance is measured using a CS2000 spectroscopy.

Syntheses are performed under an inert gas atmosphere (nitrogen flowing condition) unless particularly mentioned.

Synthesis of Quantum Dot Having ZnTeSe Core and ZnSeTe/ZnSe/ZnS Shell

Example 1

1. Selenium and tellurium are dispersed in trioctylphosphine (TOP) to obtain a 2 M (mole/L) Se/TOP stock solution and a 0.1 M Te/TOP stock solution.

On the other hand, zinc acetate along with palmitic acid is dissolved in trioctylamine in a 300 milliliter (mL) reaction flask and then, heated at 120° C. under vacuum. After 1 hour, the atmosphere in the reactor is converted to an inert gas.

After heating the solution at 300° C., the Se/TOP stock solution and the Te/TOP stock solution produced above are rapidly injected thereinto at a predetermined ratio of Te:Se. After 60 minutes, the obtained reaction solution is cooled down to room temperature, acetone is added thereto, the obtained mixture is centrifuged to obtain a precipitate, and the precipitate is dispersed in toluene to obtain a ZnSeTe core.

Herein, a Zn precursor and a Se precursor are used in a Zn:Se mole ratio of 2:1, and a mole ratio of Te with respect to Se (Te:Se) is 0.03:1.0.

2. Trioctylamine (TOA) is put in a 300 mL reaction flask, zinc acetate and oleic acid in a mole ratio of 1:2 are added thereto, and the obtained mixture is treated under vacuum at 120° C. The atmosphere inside of the flask is replaced with nitrogen (N$_2$). The ZnSeTe core in the toluene dispersion is rapidly added thereto, while the flask is heated up to 300° C., the Se/TOP stock solution and the Te/TOP stock solution are added thereto, and the obtained mixture is reacted for 30 minutes to form a ZnSeTe layer on the core. Then, the Se/TOP stock solution along with zinc acetate is added thereto and reacted for 60 minutes to form a ZnSe layer. Then, the S/Top stock solution along with zinc acetate is added thereto and then, reacted for 30 minutes to form a ZnS layer. Herein, a Zn precursor, a Se precursor, and a S precursor are used in a mole ratio of 5:2:3, and an amount of Te as used, with respect to 1 mole of Se is 0.008 moles.

Photoluminescence characteristics of a quantum dot produced therefrom are analyzed, and the results are shown in Table 1.

Inductively coupled plasma atomic emission spectrometry (ICP-AES) of the produced quantum dot is analyzed, and the results are shown in Table 2.

Example 2

A core/shell quantum dot is produced according to the same method as Example 1 except that the shell is formed by using 0.01 moles of Te, with respect to 1 mole of Se.

Photoluminescence characteristics of the quantum dot are analyzed, and the results are shown in Table 1.

Inductively coupled plasma atomic emission spectrometry (ICP-AES) of the produced quantum dot is performed, and the results are shown in Table 2.

Example 3

A core/shell quantum dot is produced according to the same method as Example 1 except that the core is formed by using 0.05 moles of Te, with respect to 1 mole of Se, and the shell is formed by using 0.008 moles of Te, with respect to 1 mole of Se.

Photoluminescence characteristics of the produced quantum dot are analyzed, and the results are shown in Table 1.

Example 4

A core/shell quantum dot is produced according to the same method as Example 1 except that the core is formed by using 0.028 moles of Te, with respect to 1 mole of Se.

Photoluminescence characteristics of the produced quantum dot are analyzed, and the results are shown in Table 1.

Comparative Example 1

A core/shell quantum dot is produced according to the same method as Example 1 except that the shell is formed without using tellurium (Te).

Photoluminescence characteristics of the produced quantum dot are analyzed, and the results are shown in Table 1.

Inductively coupled plasma-atomic emission spectroscopic analysis (ICP-AES) of the quantum dot is performed, and the results are shown in Table 2.

Comparative Example 2

A core/shell quantum dot is produced according to the same method as Example 1 except that the core is formed by using 0.05 moles of Te, with respect to 1 mole of Se, and the shell is formed by using no tellurium (Te).

Photoluminescence characteristics of the produced quantum dot are analyzed, and the results are shown in Table 1.

Comparative Example 3

A core/shell quantum dot is produced according to the same method as Example 1 except that the core is formed by using 0.067 moles of Te, with respect to 1 mole of Se, and the shell is formed by using no tellurium (Te).

Photoluminescence characteristics of the produced quantum dot are analyzed, and the results are shown in Table 1.

TABLE 1

| | Te:Se in core | Te:Se in shell | PL (nm) | Full Width at Half Maximum (FWHM) (nm) | Quantum Yield (QY) (%) |
|---|---|---|---|---|---|
| Example 4 | 0.028:1 | 0.0067:1 | 452 | 24 | 73 |
| Example 2 | About 0.03:1 | 0.0100:1 | 452 | 33 | 75 |
| Example 1 | About 0.03:1 | 0.0080:1 | 450 | 27 | 77 |
| Example 3 | 0.05:1 | 0.0080:1 | 464 | 41 | 71 |
| Comparative Example 1 | 0.033:1 | — | 448 | 20 | 69 |
| Comparative Example 2 | 0.05:1 | — | 449 | 29 | 66 |
| Comparative Example 3 | 0.067:1 | — | 471 | 60 | 68 |

The results of Table 1 show that the quantum dots of the Examples include a shell of the above composition on a ZnTeSe core and thus may exhibit a light emitting wavelength of greater than or equal to 450 nm but also increased photoluminescence efficiency and a decreased full width at half maximum (FWHM). Each of Comparative Examples 1-3 does not have a light emitting wavelength of greater than or equal to 450 nm and a full width at half maximum (FWHM) of less than or equal to about 41 nanometers. When tellurium is included in an amount to provide a light emitting wavelength of greater than or equal to 450 nm, Comparative Example 3 exhibits decreased quantum yield compared with Examples 1-4 and increased full width at half maximum (FWHM) compared with Examples 1-4.

TABLE 2

| | Te:Se in core | Te:Se in shell | Mole ratio (X:Zn) | | | | Te:Se |
|---|---|---|---|---|---|---|---|
| | | | X = S | X = Zn | X = Se | X = Te | |
| Example 1 | 0.028:1 | 0.008:1 | 0.52:1 | 1:1 | 0.37:1 | 0.006:1 | 0.016:1 |
| Example 3 | 0.05:1 | 0.008:1 | 0.506:1 | 1:1 | 0.381:1 | 0.008:1 | 0.021:1 |
| Comparative Example 1 | 0.033:1 | — | 0.56:1 | 1:1 | 0.381:1 | 0.002:1 | 0.005:1 |

Referring to the results of Table 2, as for the quantum dots of Examples 1 and 3 including tellurium in a shell, a tellurium amount with respect to a selenium amount is increased compared with Comparative Example 1.

Experimental Example 1

Figure 4:
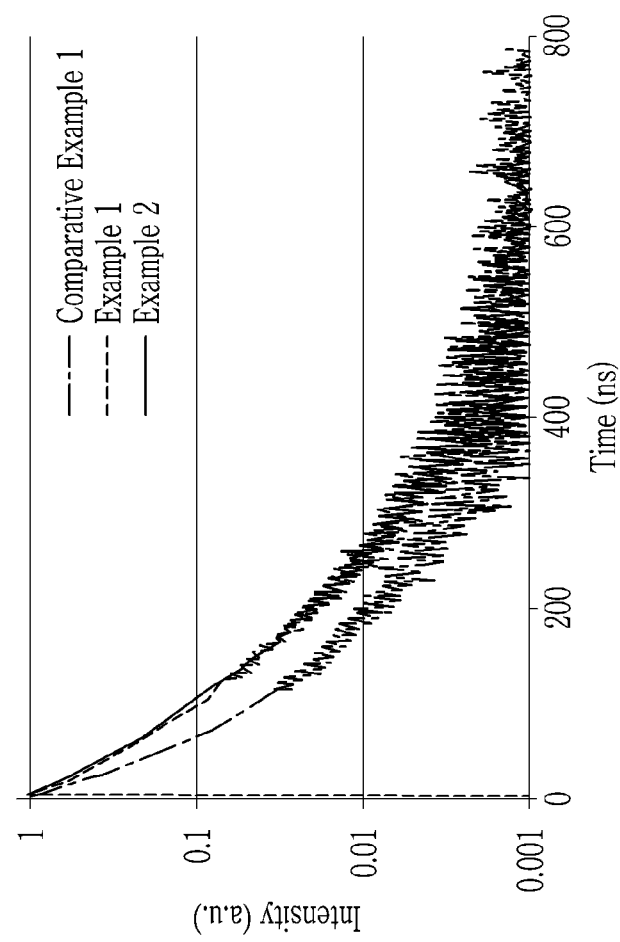
FIG. 4 is a graph of intensity (arbitrary units (a.u.)) versus time (nanoseconds (ns)) showing time resolved spectroscopic analysis results of the quantum dots produced in Examples 1 and 2 and Comparative Example 1.

A time resolved spectroscopic analysis of the quantum dots according to Examples 1 and 2 and Comparative Example 1 is performed, and the results are shown in FIG. 4 and Table 3.

TABLE 3

| | PL decay lifetime (nanoseconds (ns)) |
|---|---|
| Comparative Example 1 | 30.4 |
| Example 1 | 42.2 |
| Example 2 | 42.6 |

Referring to the results of Table 3 and FIG. 4, the quantum dots of Examples 1 and 2 may have a longer lifetime of luminance compared with the quantum dot of Comparative Example 1.

Example 5: Production of Electroluminescent Device 1

An electroluminescent device is manufactured by using the quantum dot of Example 1: A poly(3,4-ethylenedioxythiophene):poly(styrene sulfonate) (PEDOT:PSS) layer and a poly(9,9-dioctyl-fluorene-co-N-(4-butylphenyl)-diphenylamine) (TFB) layer are spin-coated to respectively form a hole injection layer HIL and a hole transport layer (HTL) on a glass substrate deposited with an indium tin oxide (ITO) electrode (an anode). On the TFB layer, a quantum dot emission layer is formed by spin-coating an octane dispersion of the quantum dot. On the quantum dot emission layer, 8-(4-(4,6-di(naphthalen-2-yl)-1,3,5-triazin-2-yl)phenyl)quinolone:8-hydroxyquinolinato lithium (ET204: Liq) is formed as the electron auxiliary layer, and then, an Al electrode is deposited thereon.

Figure 5:
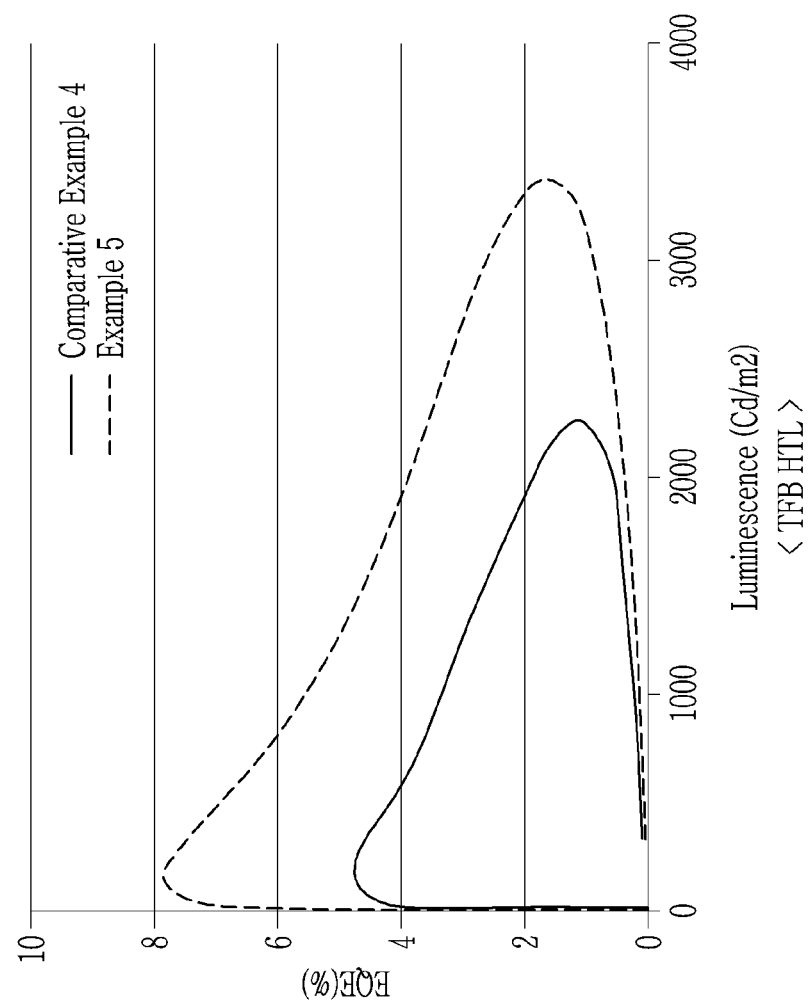
FIG. 5 is a graph of EQE (percent (%)) versus luminescence (candelas per square meter ($Cd/m^2$)) showing evaluation results of electroluminescent properties of the devices according to Example 5 and Comparative Example 4.
Figure 6:
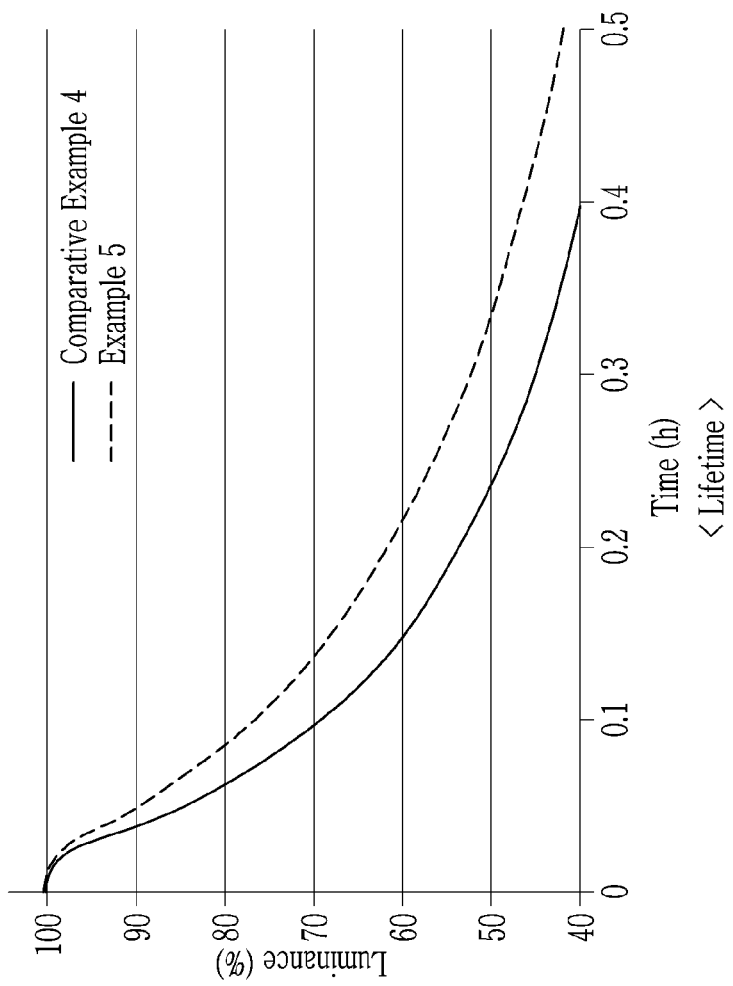
FIG. 6 is a graph of luminance (%) versus time (hours (h))) showing evaluation results of lifetime characteristics of the devices according to Example 5 and Comparative Example 4.

Electroluminescent properties of the device, and the results are shown in FIG. 5 and Table 4. Lifetime of the electroluminescent device is measured, and the results are shown in FIG. 6.

Comparative Example 4

An electroluminescent device is manufactured according to the same method as Example 5 except that the quantum dot of Comparative Example 1 is used. Electroluminescent properties of the device are evaluated, and the results are shown in FIG. 5 and Table 4. Lifetime of the electroluminescent device is evaluated, and the results are shown in FIG. 6.

Example 6

Figure 7:
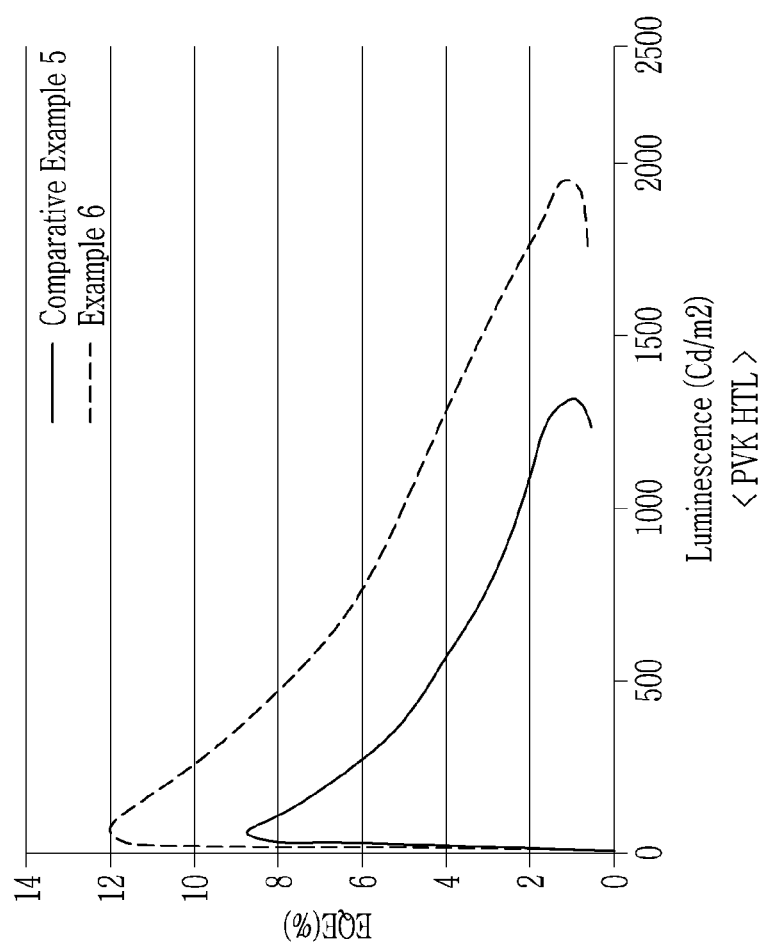
FIG. 7 is a graph of EQE (%) versus luminescence ($Cd/m^2$) showing evaluation results of electroluminescent properties of the devices according to Example 6 and Comparative Example 5.

An electroluminescent device is manufactured according to the same method as Example 5 except that the hole transport layer is formed by using poly(9-vinylcarbazole) (PVK). Electroluminescent properties of the device are evaluated, and the results are shown in FIG. 7 and Table 4.

Comparative Example 5

An electroluminescent device is manufactured according to the same method as Example 5 except that the quantum dot of Comparative Example 1 is used, and the hole transport layer (HTL) is formed by using PVK. Electroluminescent properties of the device are evaluated, and the results are shown in FIG. 6 and Table 4.

TABLE 4

|  | Te:Se in core/ Te:Se in shell | Maximum (Max.) External Quantum Efficiency (EQE) (%) | EQE at 100 nit (Candelas per square meter (Cd/m$^2$)) (%) | Max. candelas per ampere (Cd/A) | Cd/m$^2$ at 5 milliamperes (mA) |
|---|---|---|---|---|---|
| Comparative Example 4 | about 0.03:1/— | 4.7 | 4.6 | 3.1 | 155.9 |
| Example 5 | about 0.03:1/ 0.008:1 | 7.7 | 7.7 | 6.9 | 316.7 |
| Comparative Example 5 | about 0.03:1/— | 8.6 | 8.0 | 5.5 | 202.7 |
| Example 6 | about 0.03:1/ 0.008:1 | 11.8 | 11.5 | 9.7 | 349.8 |

Referring to the results of FIG. 4 and Table 3, the electroluminescent devices respectively including the quantum dots of Examples 1 and 2 exhibit improved electroluminescent properties compared with the electroluminescent device including the quantum dot of Comparative Example 1.

Referring to the results of FIG. 6, the electroluminescent devices including the quantum dots of Example 5 exhibit improved lifetime compared with the electroluminescent device including the quantum dot of Comparative Example 4.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot comprising
   a core comprising a first semiconductor nanocrystal comprising zinc, tellurium, and selenium and
   a semiconductor nanocrystal shell disposed on the core and comprising zinc, tellurium, selenium, and sulfur,
   wherein the quantum dot does not comprise cadmium,
   wherein in the quantum dot comprising the core and the semiconductor nanocrystal shell, a mole ratio of tellurium with respect to selenium is less than or equal to about 0.06:1,
   wherein in the quantum dot comprising the core and the semiconductor nanocrystal shell, a mole ratio of selenium with respect to sulfur is less than or equal to about 1.8:1,
   wherein a photoluminescence peak wavelength of the quantum dot is greater than or equal to about 450 nanometers and less than or equal to about 470 nanometers, and
   wherein a full width at half maximum of a photoluminescence peak of the quantum dot is less than or equal to about 37 nanometers.

2. The quantum dot of claim 1, wherein the quantum dot comprises a mole ratio of tellurium with respect to selenium of greater than about 0.005:1.

3. The quantum dot of claim 1, wherein the quantum dot comprises a mole ratio of tellurium with respect to zinc of greater than or equal to about 0.003:1.

4. The quantum dot of claim 1, wherein the core comprises $ZnTe_xSe_{1-x}$, wherein x is greater than 0 and less than or equal to about 0.05.

5. The quantum dot of claim 1, wherein a size of the core is greater than or equal to about 2 nanometers.

6. The quantum dot of claim 1, wherein the semiconductor nanocrystal shell comprises a concentration gradient in a radial direction.

7. The quantum dot of claim 6, wherein
   in the semiconductor nanocrystal shell, an amount of tellurium decreases in a radial direction from the core toward an outermost surface of the quantum dot and
   in the semiconductor nanocrystal shell, an amount of sulfur increases in a radial direction from the core toward an outermost surface of the quantum dot.

8. The quantum dot of claim 1,
   wherein the semiconductor nanocrystal shell comprises
   a first layer disposed directly on the core and
   an outer layer disposed on the first layer, and
   wherein the first layer comprises a second semiconductor nanocrystal and the outer layer comprises a semiconductor nanocrystal having a composition different from that of the second semiconductor nanocrystal.

9. The quantum dot of claim 8, wherein
the second semiconductor nanocrystal comprises zinc, selenium, and tellurium and
the outer layer comprises
zinc and
sulfur, selenium, or a combination thereof.

10. The quantum dot of claim 8,
wherein the outer layer comprises
a first outer layer directly on the first layer, the first outer layer comprising a third semiconductor nanocrystal and
a second outer layer disposed on the first outer layer, the second outer layer comprising a fourth semiconductor nanocrystal, and
wherein the third semiconductor nanocrystal comprises zinc and selenium and the fourth semiconductor nanocrystal comprises zinc and sulfur.

11. The quantum dot of claim 1, wherein the quantum dot has external quantum efficiency of greater than or equal to about 70%.

12. The quantum dot of claim 1, wherein a full width at half maximum of a photoluminescence peak of the quantum dot is less than or equal to about 35 nanometers.

13. The quantum dot of claim 1, wherein the quantum dot has a photoluminescence decay lifetime of greater than or equal to about 32 nanoseconds as measured by a time resolved spectroscopic analysis.

14. A method of producing the quantum dot of claim 1, comprising
obtaining a core comprising a first semiconductor nanocrystal comprising zinc, selenium, and tellurium; and
forming a semiconductor nanocrystal shell comprising zinc, selenium, tellurium, and sulfur on a surface of the core by reacting a zinc precursor with a selenium precursor, a tellurium precursor, a sulfur precursor, or a combination thereof in a plurality of times in an organic solvent and in the presence of the core and an organic ligand to produce the quantum dot.

15. The method of claim 14, wherein the core comprising the first semiconductor nanocrystal comprises a mole ratio of the tellurium with respect to the selenium of less than about 0.06:1.

16. The method of claim 14, wherein the forming of the semiconductor nanocrystal shell comprises reacting the zinc precursor with the selenium precursor and the tellurium precursor and reacting the zinc precursor with the selenium precursor, the sulfur precursor, or a combination thereof.

17. The method of claim 14, wherein the zinc precursor comprises a Zn powder, ZnO, an alkylated Zn compound, a Zn alkoxide, a Zn carboxylate, Zn nitrate, Zn perchlorate, Zn sulfate, Zn acetylacetonate, a Zn halide, Zn cyanide, Zn hydroxide, or a combination thereof,
the selenium precursor comprises selenium-trioctylphosphine, selenium-tributylphosphine, selenium-triphenylphosphine, selenium-diphenylphosphine, or a combination thereof,
the tellurium precursor comprises tellurium-tributylphosphine, tellurium-triphenylphosphine, tellurium-diphenylphosphine, or a combination thereof, and
the sulfur precursor comprises hexane thiol, octane thiol, decane thiol, dodecane thiol, hexadecane thiol, mercapto propyl silane, sulfur-trioctylphosphine, sulfur-tributylphosphine, sulfur-triphenylphosphine, sulfur-trioctylamine, bistrimethylsilyl sulfur, ammonium sulfide, sodium sulfide, or a combination thereof.

18. An electronic device comprising the quantum dot of claim 1.

19. An electroluminescent device, comprising
a first electrode and a second electrode facing each other; and
a quantum dot emission layer disposed between the first electrode and the second electrode and comprising a plurality of quantum dots,
wherein the plurality of quantum dots comprises the quantum dot of claim 1.

20. The electroluminescent device of claim 19, wherein the electroluminescent device comprises a charge auxiliary layer between the first electrode and the quantum dot emission layer, between the second electrode and the quantum dot emission layer, or between the first electrode and the quantum dot emission layer and between the second electrode and the quantum dot emission layer.

21. The electroluminescent device of claim 20, wherein the charge auxiliary layer comprises a charge transport layer, a charge injection layer, or a combination thereof.

22. The electroluminescent device of claim 19, wherein the electroluminescent device has a maximum external quantum efficiency of greater than or equal to about 4%.

23. The electroluminescent device of claim 19, wherein the electroluminescent device is configured to emit light having an x value of a CIE color space chromaticity diagram of less than or equal to about 0.2.

* * * * *